(12) United States Patent
Kotagi et al.

(10) Patent No.: US 12,119,209 B2
(45) Date of Patent: Oct. 15, 2024

(54) DYNAMIC PROCESSING CHAMBER BAFFLE

(71) Applicant: Applied Materials, Inc., Santa Clara, CA (US)

(72) Inventors: Udit S. Kotagi, Dharwad (IN); Mayur Govind Kulkarni, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 317 days.

(21) Appl. No.: 17/498,189

(22) Filed: Oct. 11, 2021

(65) Prior Publication Data
US 2023/0114104 A1    Apr. 13, 2023

(51) Int. Cl.
*H01J 37/32*    (2006.01)

(52) U.S. Cl.
CPC .... *H01J 37/3244* (2013.01); *H01J 37/32697* (2013.01); *H01J 37/32715* (2013.01); *H01J 37/32733* (2013.01); *H01J 2237/3323* (2013.01); *H01J 2237/334* (2013.01)

(58) Field of Classification Search
CPC ............. H01J 37/3244; H01J 37/32697; H01J 37/32715; H01J 37/32733; H01J 2237/3323; H01J 2237/334
See application file for complete search history.

(56) References Cited

U.S. PATENT DOCUMENTS

| | | | |
|---|---|---|---|
| 2002/0076490 A1* | 6/2002 | Chiang | H01J 37/32449 257/E21.171 |
| 2003/0092278 A1 | 5/2003 | Fink | |
| 2003/0232512 A1 | 12/2003 | Dickinson et al. | |
| 2004/0108301 A1 | 6/2004 | Hao et al. | |
| 2019/0341233 A1 | 11/2019 | Nguyen et al. | |
| 2019/0352774 A1* | 11/2019 | Chan | H01J 37/32871 |
| 2021/0050190 A1* | 2/2021 | Miura | H01J 37/32834 |
| 2021/0366724 A1* | 11/2021 | Asako | H01L 21/31116 |

FOREIGN PATENT DOCUMENTS

| | | |
|---|---|---|
| TW | 540093 B | 7/2003 |
| TW | 202010862 A | 3/2020 |

OTHER PUBLICATIONS

Application No. PCT/US2022/046147, International Search Report and the Written Opinion, Mailed on Feb. 3, 2023, 12 pages.

* cited by examiner

*Primary Examiner* — Renan Luque
(74) *Attorney, Agent, or Firm* — Kilpatrick Townsend & Stockton LLP

(57) ABSTRACT

Exemplary methods of semiconductor processing may include delivering a deposition precursor into a processing region of a semiconductor processing chamber. The methods may include depositing a layer of material on a substrate housed in the processing region of the semiconductor processing chamber. The processing region may be maintained at a first pressure during the deposition. The methods may include extending a baffle within the processing region. The baffle may modify a flow path within the processing region. The methods may include forming a plasma of a treatment or etch precursor within the processing region of the semiconductor processing chamber. The processing region may be maintained at a second pressure during the forming. The methods may include treating the layer of material deposited on the substrate with plasma effluents of the treatment precursor. The processes may be cycled any number of times.

20 Claims, 5 Drawing Sheets

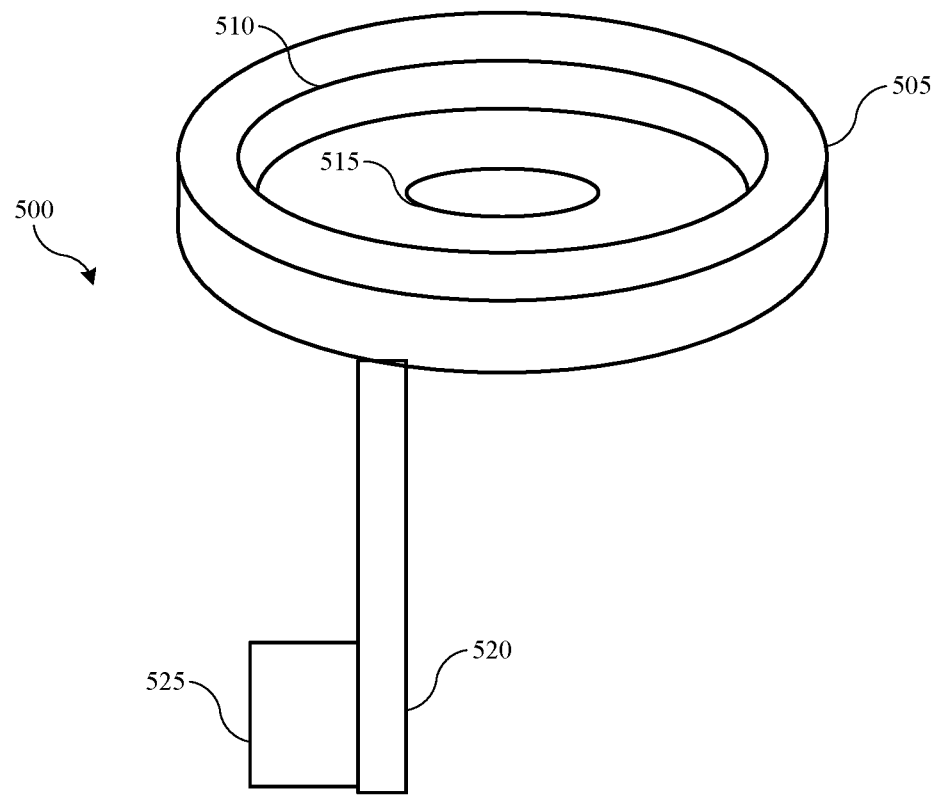
FIG. 5
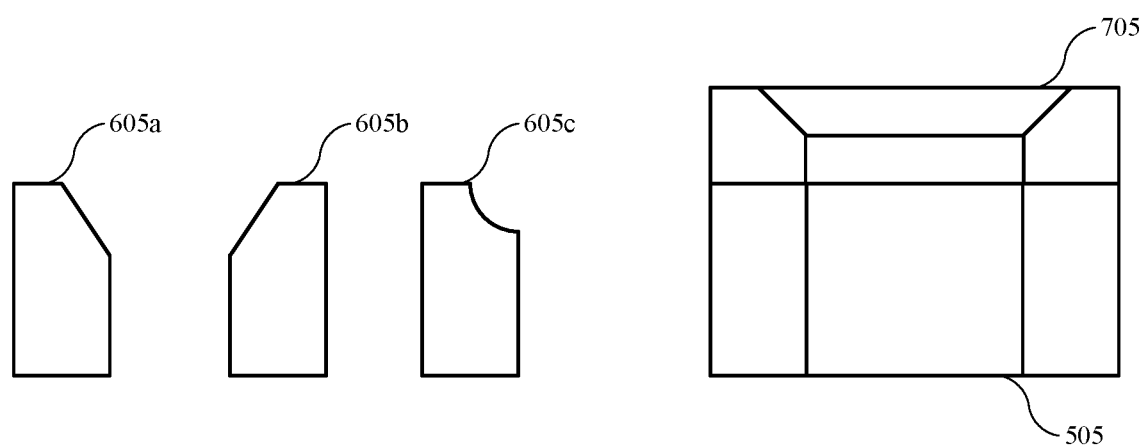
FIG. 6
FIG. 7

DYNAMIC PROCESSING CHAMBER BAFFLE

TECHNICAL FIELD

The present technology relates to components and apparatuses for semiconductor manufacturing. More specifically, the present technology relates to processing chamber components and other semiconductor processing equipment, as well as methods of operation.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process.

Thus, there is a need for improved systems and methods that can be used to produce high quality devices and structures. These and other needs are addressed by the present technology.

SUMMARY

Exemplary methods of semiconductor processing may include delivering a deposition precursor into a processing region of a semiconductor processing chamber. The methods may include depositing a layer of material on a substrate housed in the processing region of the semiconductor processing chamber. The processing region may be maintained at a first pressure during the deposition. The methods may include extending a baffle within the processing region. The baffle may modify a flow path within the processing region. The methods may include forming a plasma of a treatment or etch precursor within the processing region of the semiconductor processing chamber. The processing region may be maintained at a second pressure during the forming. The methods may include treating the layer of material deposited on the substrate with plasma effluents of the treatment precursor. The processes may be cycled any number of times.

In some embodiments, the semiconductor processing chamber may include a faceplate. The chamber may include a substrate support on which the substrate is seated. The processing region may be defined between the faceplate and the substrate support. The chamber may include a pumping ring. The pumping ring may extend circumferentially about the processing region. The baffle may extend about the substrate support. Extending the baffle may include moving the baffle towards the faceplate. The baffle in an extended position may restrict a flow path to the pumping ring. The baffle may reduce a gap distance between an interior edge of the pumping ring and an exterior edge of the faceplate by greater than or about 10%. Depositing the layer of material may be performed at a pressure within the processing region of greater than or about 100 Torr. Forming the plasma of the treatment precursor may be performed at a pressure within the processing region of less than or about 20 Torr. The substrate may be maintained at a temperature of greater than or about 400° C. during the depositing and during the treating. The baffle may include an end effector defining an interior shape configured to control flow to an exhaust system. The methods may include, subsequent to depositing the layer of material on the substrate, moving the substrate towards a faceplate of the semiconductor processing chamber.

Some embodiments of the present technology encompass semiconductor processing systems. The systems may include a chamber body include sidewalls and a base. The chamber body may define a processing region. The systems may include a substrate support extending through the base of the chamber body. The substrate support may be configured to support a substrate within the processing region. The systems may include a faceplate defining a plurality of apertures through the faceplate. The faceplate may define the processing region from above. The systems may include a pumping ring extending about the processing region and providing an exhaust path from the processing region. The systems may include a baffle extending about the substrate support. The baffle may be translatable between a first position in which the baffle is retracted about the substrate support and a second position in which the baffle is extended into the processing region.

In some embodiments, the baffle in the second position may reduce a gap distance between an interior edge of the pumping ring and an exterior edge of the faceplate by greater than or about 10%. The baffle in the second position may intersect a flow path between the faceplate and the pumping ring. The baffle may include a dish defining a central recess. The baffle may include an aperture extending through the dish and configured to receive a stem of the substrate support. The baffle may include one or more posts coupling the dish with an actuator. The baffle may include an end effector defining an interior shape configured to control flow to an exhaust system. The baffle may include a ceramic material.

Some embodiments of the present technology encompass methods of semiconductor processing. The methods may include delivering a deposition precursor into a processing region of a semiconductor processing chamber. The methods may include depositing a layer of material on a substrate housed in the processing region of the semiconductor processing chamber. The processing region may be maintained at a first pressure greater than or about 100 Torr during the depositing. The methods may include extending a baffle within the processing region. The baffle may modify a flow path within the processing region. The methods may include forming a plasma of a treatment precursor within the processing region of the semiconductor processing chamber. The processing region may be maintained at a second pressure less than or about 20 Torr during the forming. The methods may include treating the layer of material deposited on the substrate with plasma effluents of the treatment precursor.

In some embodiments, the baffle may reduce a gap distance between an interior edge of a pumping ring defining an exhaust path and an exterior edge of a faceplate defining the processing region from above by greater than or about 10%. The semiconductor processing chamber may include a faceplate. The chamber may include a substrate support on which the substrate is seated. The processing region may be defined between the faceplate and the substrate support. The chamber may include a pumping ring. The pumping ring may extend circumferentially about the processing region, and wherein the baffle extends about the substrate support. The baffle may include a dish defining a central recess. The baffle may include an aperture extending through the dish and configured to receive a stem of the substrate support. The baffle may include one or more posts coupling the dish with an actuator. The baffle may include an end effector coupled with the dish and defining an interior shape of the baffle configured to control flow to an exhaust system.

Such technology may provide numerous benefits over conventional systems and techniques. For example, embodiments of the present technology may allow a treatment process to be performed in the same chamber in which deposition occurred. Additionally, the components may allow modification to accommodate any number of chambers or processes to improve uniformity of processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 5 shows a schematic perspective view of an exemplary baffle assembly according to some embodiments of the present technology.

FIG. 6 shows schematic edge effects for exemplary baffles according to some embodiments of the present technology.

FIG. 7 shows a schematic cross-sectional view of an exemplary baffle assembly including an end effector according to some embodiments of the present technology.

Figure 1:
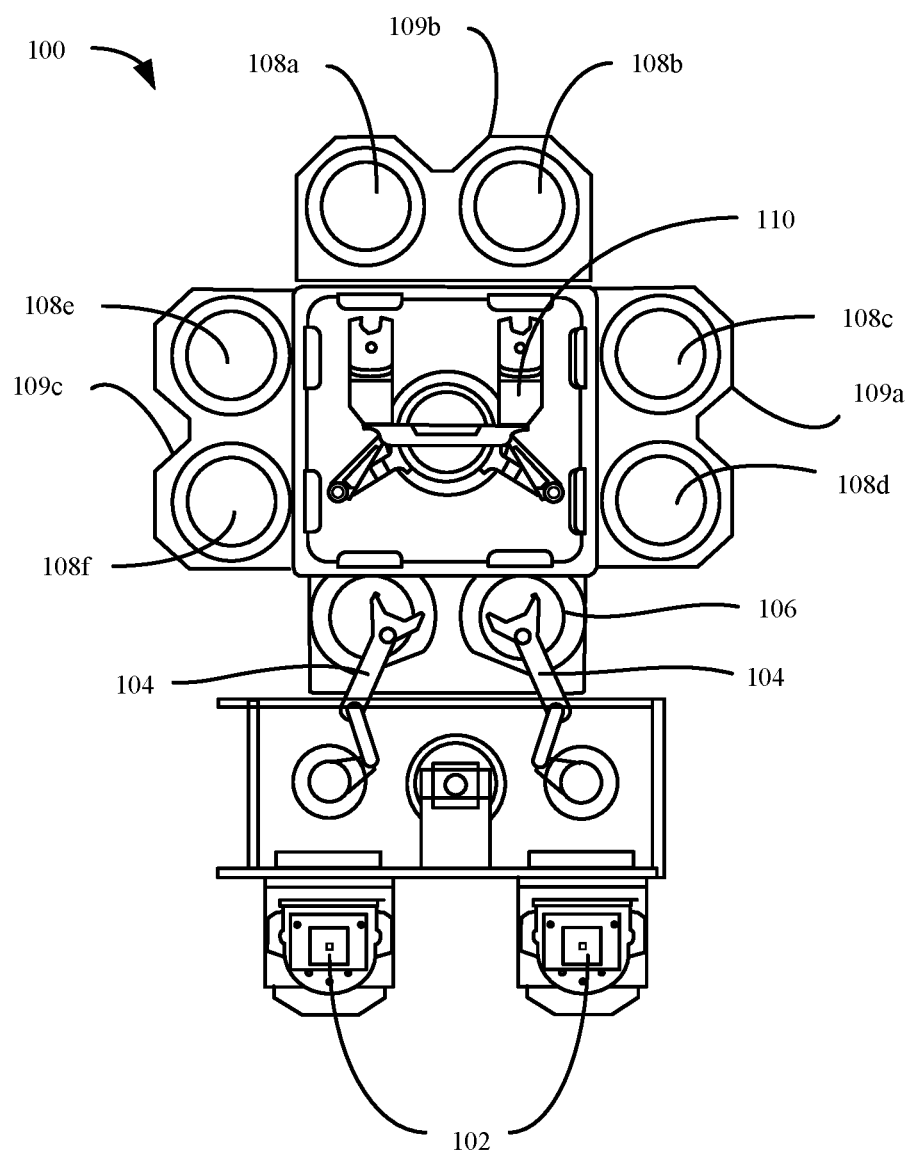
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Deposition processes in semiconductor processing may be performed in a number of ways, including thermally or plasma enhanced chemical vapor deposition. Processes that may be used to fill high aspect ratio features may include precise chamber configurations and processing conditions to perform the filling operations. For example, sub-atmospheric chemical vapor deposition may include a thermally-activated deposition occurring at relatively high chamber pressures. Once the deposition has occurred, a second operation may be performed to treat the deposited material, such as to densify the film, for example, as well as to improve gapfill performance.

As device features reduce in size, tolerances across a substrate surface may be reduced, and chamber configurations may affect device realization and uniformity. Conventional technologies have been unable to adequately treat materials deposited by sub-atmospheric chemical vapor deposition. For example, the deposition chamber is typically optimized for high-pressure and high flow operations. Any changes to flow, pressure, or spacing can create asymmetries in the resulting film properties. For example, the treatment process, may often include a plasma process performed at much lower pressure. If the plasma process was attempted in the deposition chamber, the reduced flow rate may lead to precursors being immediately pumped from the chamber through exhaust systems configured for high-flow operation. Additionally, some systems include chambers with shared pumping between the chambers, which causes asymmetric pumping within each chamber. To accommodate this asymmetry, pumping liners, which may extend about the processing region, may be characterized by asymmetric exhaust aperture formation, which may balance the exhaust from the chamber. However, this setup may be incapable of balancing low-flow exhaust, which may fail to reduce conductance of the flow and cause non-uniform exhaust, and which may lead to non-uniform processing on the substrate. Consequently, conventional technologies have been forced to perform treatments in separate chambers optimized for low flow, which leads to increased queue time and potential vacuum break.

The present technology overcomes these challenges by utilizing a chamber setup including a retractable baffle allowing modification of the processing volume. This adjustable configuration, which may be adjusted in situ, may provide dynamic control over chamber conductance. By increasing residence time of low-flow precursors and reducing conductance from the chamber to the exhaust, the baffle and chamber configuration may accommodate high-pressure processing as well as low-pressure processing. Accordingly, the present technology may improve uniformity of processing during separate operations, as well as allow single-chamber processing to be performed at different pressure regimes.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include a baffle system according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100. Because the processing chambers may be included as pairs, each paired set of chambers may include a single pumping system including a single access for each chamber.

Figure 2:
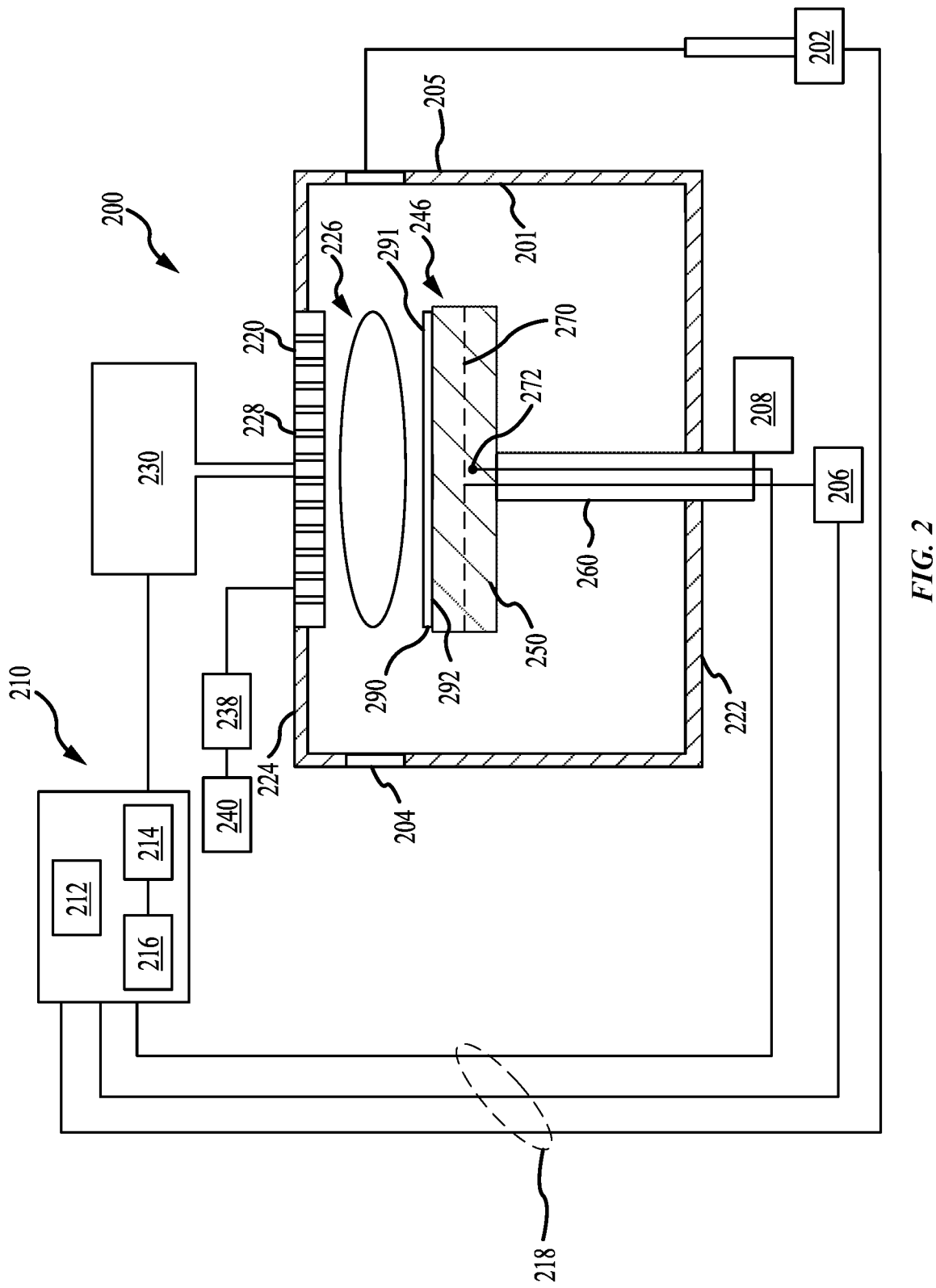
FIG. 2 shows a schematic cross-sectional view of an exemplary plasma system according to some embodiments of the present technology.

FIG. 2 shows a schematic cross-sectional view of an exemplary semiconductor processing system 200 according to some embodiments of the present technology, and which may include one of a paired set of chambers, or which may be incorporated as a standalone chamber. However, it is to be understood that the present technology may be applicable to any type of chamber, including single standalone chambers, twin chambers, quad chambers, or any other chamber setup. The figure may illustrate an overview of systems incorporating one or more aspects of the present technology as described further below, and/or which may be specifically configured to perform one or more operations according to embodiments of the present technology. Additional details of the system 200, such as an incorporated baffle, and methods performed within the chamber or any other chamber, are described further below. However, it is to be understood that the methods may similarly be performed in any system within which multiple pressure regimes may be accommodated as discussed throughout the present disclosure.

Semiconductor processing system 200 may include semiconductor processing chamber 205, which may include a top wall 224 or lid, a sidewall 201, and a bottom wall 222 that may define a substrate processing region 226, and may form a chamber body. A gas panel 230 and a controller 210 may be coupled with the process chamber 205. A substrate support assembly 246 may be provided in the substrate processing region 226 of the process chamber 205. The substrate support assembly 246 may include an electrostatic chuck 250 supported by a stem 260. The electrostatic chuck 250 may be fabricated from aluminum, ceramic, and other suitable materials such as stainless steel. The electrostatic chuck 250 may be moved inside the process chamber 205 using a mechanism 208 allowing relative changes in position between the showerhead and the wafer. For example, the relative position between the showerhead and the substrate can be adjusted in chambers according to embodiments of the present technology. A power source 206 may be used to facilitate electrostatic chucking during processing operations. A temperature sensor 272, such as a thermocouple, may be embedded in the electrostatic chuck 250 to monitor the temperature of the electrostatic chuck 250. The measured temperature may be used by the controller 210 to control the power supplied to the heater element 270 to maintain the substrate at a desired temperature.

A vacuum pump 202 may be coupled with the processing chamber, as well as a tandem pair chamber as previously described. The vacuum pump 202 may be used to maintain a desired gas pressure in the process chamber 205. The vacuum pump 202 may also evacuate post-processing gases and byproducts of the process from the process chamber 205. The vacuum pump may be coupled with a pumping ring 204, or liner, which may extend about the chamber body. The pumping ring may define a number of apertures in any configuration or size, and may allow gases and other materials to be uniformly drawn from the chamber.

A gas distribution assembly 220, or faceplate, having a plurality of apertures 228 may be disposed on the top of the process chamber 205 above the electrostatic chuck 250. The apertures 228 of the gas distribution assembly 220 may be utilized to introduce process gases, such as deposition precursors or oxidation precursors, into the process chamber 205. The apertures 228 may have different sizes, number, distributions, shapes, designs, or diameters to facilitate the flow of the various process gases for different process requirements. The gas distribution assembly 220 may be connected to the gas panel 230, such as with a delivery pipe, which may allow various gases to flow to the processing volume 226 during processing. A plasma may be formed from the process gas mixture exiting the gas distribution assembly 220 to enhance the thermal decomposition and/or ionization of the process gases resulting in the deposition or formation of a material on a top surface 291 of a substrate 290 positioned on the electrostatic chuck 250.

The gas distribution assembly 220 and the electrostatic chuck 250 may form a pair of spaced apart electrodes in the processing volume 226. One or more RF power sources 240 may provide a plasma power through a matching network 238, which may be optional, to the gas distribution assembly 220 to facilitate generation of plasma between the gas distribution assembly 220 and the electrostatic chuck 250. Alternatively, the RF power source 240 and the matching network 238 may be coupled with the gas distribution assembly 220, the electrostatic chuck 250, or coupled with both the gas distribution assembly 220 and the electrostatic chuck 250, or coupled with an antenna disposed exterior to the process chamber 205. In some embodiments, the RF power source 240 may produce power at a frequency of greater than or about 100 KHz, greater than or about 500 KHz, greater than or about 1 MHz, greater than or about 10 MHz, greater than or about 20 MHz, greater than or about 50 MHz, greater than or about 100 MHz, among other frequency ranges. Specific examples of frequencies of the power produced by RF power source 240 include 350 KHz, 2 MHz, 13.56 MHz, 27 MHz, 40 MHz, 60 MHz, 100 MHz, and 162 MHz, among other frequencies.

The controller 210 may include a central processing unit ("CPU") 212, a memory 216, and a support circuit 214, which may be utilized to control the process sequence and regulate the gas flows from the gas panel 230. The CPU 212 may be of any form of a general-purpose computer processor that may be used in an industrial setting. The software routines may be stored in the memory 216, such as random access memory, read only memory, floppy or hard disk drive, or any other form of digital storage. The support circuit 214 may be coupled with the CPU 212 and may include cache, clock circuits, input/output systems, power supplies, and any other associated component. Bi-directional communications between the controller 210 and the various components of the substrate processing system 200 may be handled through numerous signal cables collectively referred to as signal buses 218, some of which are illustrated in the figure.

As noted above, the present technology may include one or more additional components or features allowing high pressure and low pressure operations to be performed within the same processing chamber. High pressure processing may utilizing high volumes of processing gases as well. To ensure adequate exhausting of materials from the chamber, pumping rings may include apertures sized to accommodate the high flow. Because of asymmetric pumping in some systems, the apertures may be sized and spaced to adjust the flow resistance within the processing chamber, and increase or reduce conductance by adjusting a pressure drop to the exhaust, and which may be performed in order to ensure uniform exhausting at multiple pressure regimes. However, these apertures may not be sized for low flow operation, leading conventional technologies to perform subsequent processing in different chambers.

Figure 3:
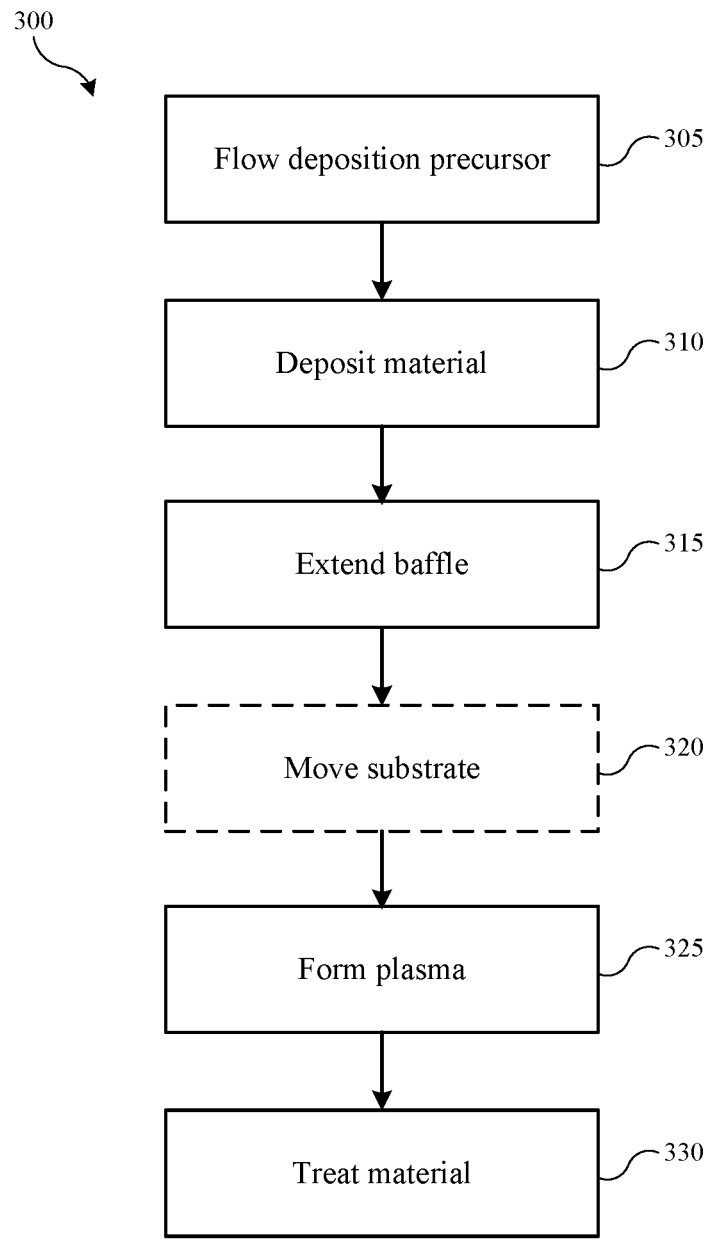
FIG. 3 shows operations of an exemplary method of semiconductor processing according to some embodiments of the present technology.

The present technology may include features allowing processing at multiple pressure regimes to be performed in the same processing chamber. Turning to FIG. 3 is shown exemplary operations in a method 300 for semiconductor processing according to embodiments of the present technology. Method 300 may include one or more operations prior to the initiation of the method, including front-end processing, deposition, etching, polishing, cleaning, or any other operations that may be performed prior to the described operations. For example, the method may begin after processing has been performed, which may produce high-aspect ratio gaps or structures that may be filled with dielectric material. However, the description is not intended to limit the technology to this process alone. Some or all of the operations may be performed in chambers or system tools as previously described, or may be performed in chambers incorporating a baffle.

Method 300 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations that may be performed in chambers shown schematically in FIGS. 4A-4B, the illustrations of which will be described in conjunction with the operations of method 300. It is to be understood that the figures illustrate only partial schematic views, and a processing chamber may contain any number of components as illustrated in the figures, as well as alternative structural aspects that may still benefit from operations of the present technology.

Figure 4A:
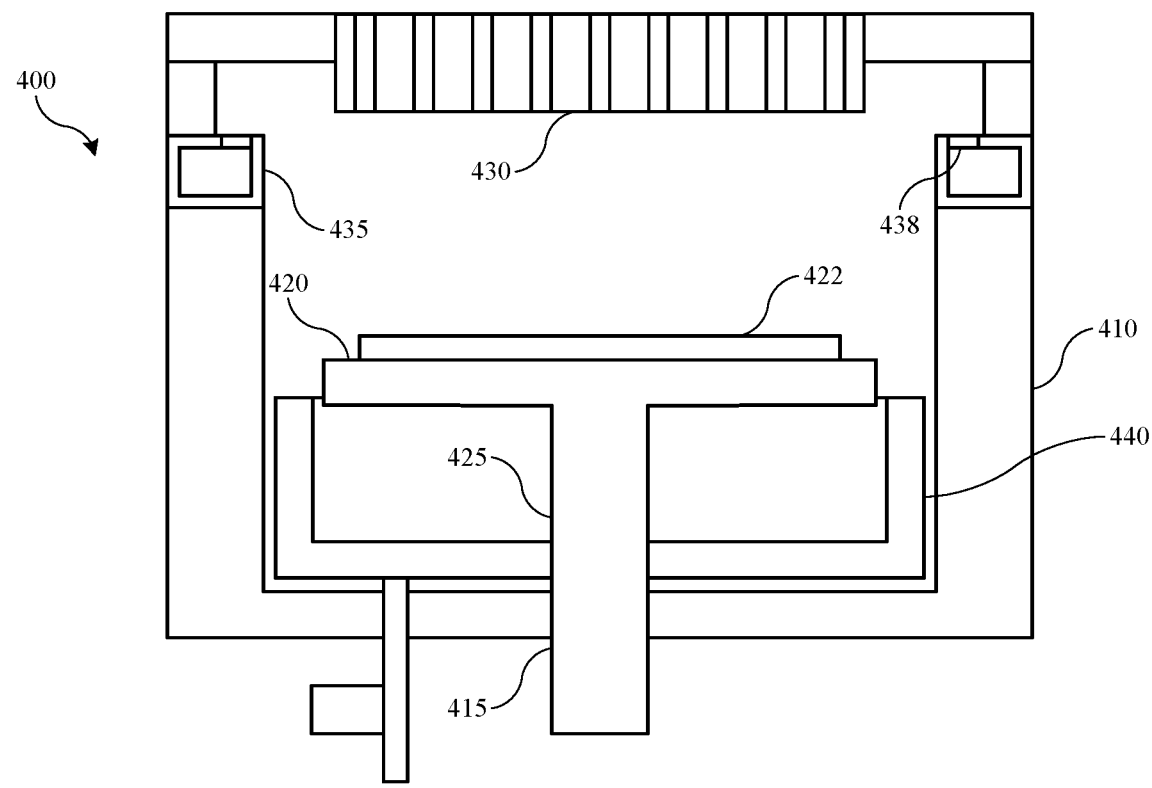
FIGS. 4A-4B show a schematic cross-sectional views of an exemplary processing system according to some embodiments of the present technology.

Once a substrate is prepared for a deposition operation, such as including features to be filled with material, or any structure on which deposition may occur, the substrate may be delivered into a processing chamber. An exemplary chamber is illustrated in FIG. 4A, which shows a schematic partial cross-sectional view of a processing system 400 according to some embodiments of the present technology. System 400 may include any aspect of system 200 described above, and may illustrate further details relating to components in system 200, such as for an incorporated baffle, for example. The system 400 may be used to perform semiconductor processing operations including deposition of materials and treatment of the deposited materials as previously described, as well as other deposition, removal, and cleaning operations.

System 400 may include a chamber body 410, which as illustrated may include sidewalls and a base, as well as a lid in some embodiments as illustrated, all of which may at least partially define an internal volume or processing volume that may include a processing region where a substrate may be processed. A pedestal or substrate support 415 may extend through the base of the chamber into the processing region as previously discussed. The substrate support may include a support platen 420, which may support semiconductor substrate 422. The support platen 420 may be coupled with a shaft 425, which may extend through the base of the chamber. System 400 may also include a faceplate 430, and the processing region may be at least partially defined between the faceplate 430 and the substrate support 415. Additionally, system 400 may include a pumping ring 435, which may define a number of apertures 438 sized and spaced in any number of ways to provide uniform exhaustion from the processing chamber. Pumping ring 435 may extend circumferentially about the processing region as illustrated, and may be located radially outward from the faceplate and the substrate support. For example, a gap may exist between the pumping ring and each or either of the substrate support or the faceplate as illustrated, and as will be discussed further below. As explained previously, symmetric or asymmetric pumping may be coupled with the pumping ring. System 400 may also include a baffle 440, which may extend about the substrate support 415 as illustrated.

Once the substrate is positioned in the processing region, such as seated on the substrate support, method 300 may include delivering one or more deposition precursors into the processing region of the semiconductor processing chamber at operation 305. Any variety of deposition processing may be performed in embodiments of the present technology, including plasma and non-plasma deposition operations, and in one encompassed embodiment, a sub-atmospheric chemical vapor deposition process may be performed. For example, the one or more precursors may be thermally decomposed to deposit material on the substrate. The process may occur at any temperature, such as greater than or about 200° C., and may occur at greater than or about 250° C., greater than or about 300° C., greater than or about 350° C., greater than or about 400° C., greater than or about 450° C., greater than or about 500° C., greater than or about 550° C., greater than or about 600° C., or higher.

A layer of material may be deposited on the substrate at operation 310. Although the process may occur at any processing pressure, in some embodiments the process may occur at a first processing pressure, which may be a relatively higher processing pressure. For example, in some embodiments, the first pressure, or a chamber pressure during the deposition, may be greater than or about 50 Torr, and may be greater than or about 100 Torr, greater than or about 150 Torr, greater than or about 200 Torr, greater than or about 250 Torr, greater than or about 300 Torr, greater than or about 350 Torr, greater than or about 400 Torr, greater than or about 450 Torr, greater than or about 500 Torr, greater than or about 550 Torr, greater than or about 600 Torr, or higher. During these higher-pressure processes, a flow rate of one or more deposition precursors may be higher to provide adequate material for deposition. For example, the total flow rate during deposition may be greater than or about 1 slm, and may be greater than or about 5 slm, greater than or about 10 slm, greater than or about 15 slm, greater than or about 20 slm, greater than or about 25 slm, greater than or about 30 slm, greater than or about 35 slm, greater than or about 40 slm, greater than or about 45 slm, greater than or about 50 slm, greater than or about 55 slm, greater than or about 60 slm, or higher.

The present technology may not be limited to any particular deposition process, and may be used in any number of deposition processes, including silicon-containing materials, carbon-containing materials, oxygen-containing materials, nitrogen-containing materials, or any other material that may be deposited during semiconductor processing. As one non-limiting example, in some embodiments a sub-atmospheric deposition may be performed for silicon oxide formation. The process may include any number of precursors, such as a silicon-containing precursor, such as silane, tetraethyl orthosilicate, or any other silicon-containing material. Diatomic oxygen, ozone, nitrous oxide, or any other oxygen-containing precursor, as well as any other oxidizer, may be provided, as well as one or more carrier and/or inert gases, such as nitrogen, argon, or any other material. The flow may be greater than or about 20 slm, greater than or about 30 slm, or more, and the processing pressure may be greater than or about 400 Torr, greater than or about 500 Torr, or more. Again, one of skill would readily appreciate that any number of other deposition processes could similarly be performed in systems according to embodiments of the present technology.

As explained previously, system 400 may be configured to accommodate the higher pressure, higher flow rate processes of deposition, which may include larger apertures about the pumping ring, and any number of other chamber or system features to accommodate these processing conditions. Because the system may be configured to accommodate high-flow, high-pressure processing, a baffle may not be needed during the deposition operations. As shown in FIG. 4A, baffle 440 may be fully retracted within the processing region during the deposition operation, and may have limited or no impact on processing during the deposition operations. However, once deposition has been completed, the baffle may be used to facilitate lower pressure plasma treatment or any subsequent processing that may occur at a different processing pressure, and which may be encompassed by embodiments of the present technology.

Figure 4B:
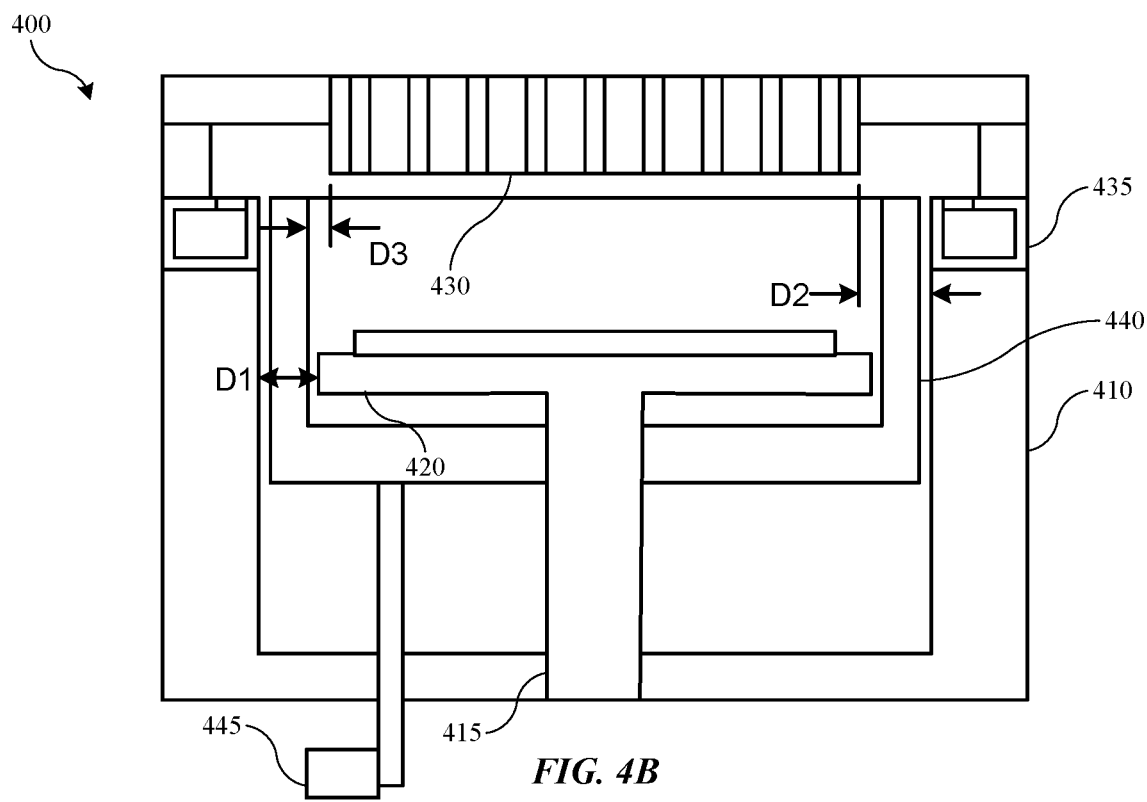

For example, once deposition has been completed, delivery of one or more of the deposition precursors may be halted, and in some embodiments flow of all of the deposition precursors may be halted. The processing region may then be adjusted in preparation for a subsequent treatment operation. For example, at operation 315, the baffle may be extended into the processing region, as illustrated in FIG. 4B. The baffle 440 may be extended into the processing space to modify a flow path within the processing region. For example, while the pumping ring apertures may be sized for high-flow conditions, the apertures may not fully provide sufficient resistance to flow for low-flow conditions, which may allow asymmetric pumping to non-uniformly draw from the chamber, and which may cause non-uniformity issues on the substrate based on non-uniform flow of materials. Baffle 440 may at least partially block flow towards the pumping ring 435, which may increase residence time of low-flow materials, and ensure uniformity in treatment and exhausting may be maintained.

Extending the baffle 440 into the processing region may include utilizing an actuator 445 to drive the baffle into the chamber. The actuator may be operated by a system controller, such as controller 210 discussed above. The baffle may exist at least partially inside the processing chamber and may be fully contained within the processing chamber, although one or more posts or supports may extend outside the chamber to couple with the actuator, and thus seals, bellows, or any other component may be included to maintain the vacuum environment during the processing. For example, bellows and/or seals may extend about each post of the baffle assembly, which may extend through the base of the chamber body. The baffle may be extended towards the faceplate as illustrated, and may extend toward, to, or past an upper surface of the pumping ring 435. This may allow the baffle to restrict a flow path to the pumping liner, such as by reducing a gap distance between an inner surface of the pumping ring and an outer surface of either the faceplate or the substrate support. For example, as illustrated in the figure, the support platen 420 of the substrate support 415 may extend outward, and an outer edge of the platen may be characterized by a gap distance D1 relative to an interior edge of the pumping ring 435. Similarly, the faceplate 430 may have an outer edge, and which may be characterized by a gap distance D2 relative to an interior edge of the pumping ring 435.

When the baffle is extended into the processing region, such as to a position at or above an upper surface of the pumping liner, access to the pumping liner may be restricted to a gap distance D3, which may be at least or about 10% less than either the D1 or D2 gap distance, and may be at least or about 15% less than either the D1 or D2 gap distance, at least or about 20% less than either the D1 or D2 gap distance, at least or about 25% less than either the D1 or D2 gap distance, at least or about 30% less than either the D1 or D2 gap distance, at least or about 35% less than either the D1 or D2 gap distance, at least or about 40% less than either the D1 or D2 gap distance, at least or about 45% less than either the D1 or D2 gap distance, at least or about 50% less than either the D1 or D2 gap distance, at least or about 55% less than either the D1 or D2 gap distance, at least or about 60% less than either the D1 or D2 gap distance, at least or about 65% less than either the D1 or D2 gap distance, at least or about 70% less than either the D1 or D2 gap distance, at least or about 75% less than either the D1 or D2 gap distance, or more. By reducing the gap distance, increased flow resistance may be produced toward the pumping ring, which may adequately restrict flow to ensure uniform exhausting during low pressure processing.

In some embodiments, the substrate support 415 may be vertically translated, such as elevated towards the showerhead as shown, at optional operation 320, which may further modify the processing region prior to subsequent processing. A subsequent process may then be performed, which may be performed at a second pressure less than the first pressure at which deposition was performed. As one non-limiting example, a plasma treatment of the deposited film may be performed in some embodiments of the present technology. For example, at operation 325 a plasma may be formed of a treatment precursor within the processing region of the semiconductor processing chamber. Although a remote plasma process may be used, in some embodiments a local plasma may be formed in the processing region of the chamber. Continuing the previous non-limiting example, a treatment precursor may be flowed into the processing region and a plasma may be generated of the treatment precursor. At operation 330, the layer of material deposited on the substrate may be treated with plasma effluents of the treatment precursor.

As explained previously, the treatment or etching operations may be performed at a second pressure less than the first, which in some embodiments may be an order of magnitude lower pressure, for example. The treatment operation may be performed at a second pressure, which may be less than the first pressure at which deposition was performed, and which may be less than or about 100 Torr, and may be less than or about 75 Torr, less than or about 50 Torr, less than or about 30 Torr, less than or about 20 Torr, less than or about 15 Torr, less than or about 12 Torr, less than or about 10 Torr, less than or about 8 Torr, less than or about 6 Torr, less than or about 4 Torr, less than or about 3 Torr, less than or about 2 Torr, less than or about 1 Torr, less than or about 0.5 Torr, or less. Additionally, the treatment precursor or precursors may be flowed at a total flowrate of less than or about 20 slm, and may be flowed at a rate of less than or about 15 slm, less than or about 12 slm, less than or about 10 slm, less than or about 8 slm, less than or about 6 slm, less than or about 4 slm, less than or about 2 slm, less than or about 1 slm, less than or about 0.5 slm, or less. Precursors used in treatment and/or etching operations may be or include halogen-containing precursors, such as fluorine or chlorine containing precursors, oxygen-containing precursors, hydrogen-containing precursors, nitrogen-containing precursors, carrier or inert gases, or any number of additional materials.

Continuing the non-limiting example, helium, argon, or some other material may be flowed into the processing region and a plasma may be formed to produce helium plasma effluents, which may interact with the deposited film. This may densify or improve the quality of the film previously deposited. This low pressure, low flow treatment relative to the deposition may not allow the apertures of the pumping liner to control the flow from the chamber. However, with the extended baffle, residence time may be increased, and an external restriction in the flow path between the exterior of the baffle and the interior of the pumping ring may facilitate uniform exhaust from the chamber. Accordingly, the present technology may allow uniform deposition and treatment to be performed within the same processing chamber across a wide pressure differential.

Similarly, or additionally, an etch process may be performed utilizing a halogen-containing material as noted above, which may be delivered at any of the flows or pressures described above, and which may occur at a lower total flow rate than a treatment operation. Much like the treatment described above, this low pressure, low flow etch may require increased flow resistance to the exhaust. Again, the baffle may be raised to a similar or different position as in the treatment, which may accommodate the flow and pressure regime for the etch process. In embodiments of the present technology, flow conductance can be controlled by adjusting flow resistance to the exhaust, which may be performed dynamically with the position of the baffle. This may allow any number of operations to be accommodated in a single chamber across a wide range of conditions.

Because the baffle may be exposed to plasma effluents or other corrosive materials, baffles according to embodiments of the present technology may be formed of any number of materials, such as ceramics, aluminum, oxidized materials, or coated materials, such as a coated aluminum. Additionally, the baffle may be grounded or at the same potential as the chamber body or substrate support, or otherwise configured to control or limit an effect on plasma conditions during processing. The baffles may also be characterized by any number of shapes or forms conducive to semiconductor processing chambers. For example, FIG. 5 illustrates a schematic perspective view of an exemplary baffle assembly 500 according to some embodiments of the present technology, and may illustrate one or more aspects of any baffle discussed throughout the present technology, such as baffle 440 discussed above. It is to be understood that baffle assembly 500 may include any feature, aspect, or component of baffles discussed above, and may be included in any chamber discussed above, or any chamber with which baffle assembly 500 may be used to facilitate processing.

Baffle assembly 500 may extend about the substrate support of some chambers as previously described, and thus may be formed to extend about gas delivery features as well. As one non-limiting example of a baffle assembly according to embodiments of the present technology, baffle assembly 500 may include a dish 505 that defines a central recess 510. Central recess 510 may be sized to ensure the recess is characterized by a greater diameter and greater depth than the platen of the substrate support. This may limit heat or electrical effects between the two components, for example. Dish 505 may be positioned within the processing region, and may be characterized by a height as shown, which may be at least partially based on dimensions within the processing chamber. For example, dish 505 may be characterized by a height to extend from the bottom of the substrate support platen at least to the top of the pumping ring as previously described. This height may ensure that precursors or other gases delivered through the faceplate are maintained within the processing region for a sufficient time to promote uniform treatment prior to being drawn from the chamber, so the dish may properly operate as a flow resistor as previously described. In some embodiments, dish 505 may be formed of process compatible materials, such as ceramics, for example, although any materials may be used in some embodiments. Additionally, the dish may be characterized by an exterior diameter configured to reduce the gap by any amount as previously described.

The dish may also define a central aperture 515, which may be sized to accommodate the substrate support stem, and which may allow the two components to move independently in embodiments of the present technology. Dish 505 may be coupled with a post 520, which may extend into and through the base of the processing chamber, and which may have a motor 525 or actuator configured to raise and lower the baffle assembly within the processing chamber. The motor may be operated by controller 210 as previously described. The system may allow the dish 505 to be retracted within the processing chamber to limit an effect on processing, such as during high-pressure processing. The system may also allow the dish 505 to be extended within the processing region to operate as a restriction during low-pressure processing, for example.

Baffles according to embodiments of the present technology may be characterized by features that can further facilitate or develop flow of precursors within the processing chamber. FIG. 6 illustrates exemplary edge treatments that may be formed about an interior or exterior of the dish or baffles within the processing region, and which may further tune flow properties within the processing region. For example, dish 605a may include any aspect of any baffle discussed above, and may include an interior taper, which may allow precursors delivered through the showerhead to flow outward without adjusting to an interior corner of the baffle. Similarly dish 605b may be characterized by an exterior taper, which may allow more gradual choking as materials flow over a top of the dish and towards the pumping ring. Baffles according to embodiments of the present technology may be characterized by one or more of an interior edge treatment or an exterior edge treatment, which may recess material or form a protrusion extending further into the processing region in embodiments of the present technology. Additionally, along with a tapered effect of any degree, baffles may include other shaped interior or exterior profiles, which may include a curved feature as illustrated in first ring 605c. The edge treatments illustrated are not intended to be limiting as any number of profiles may be formed and are encompassed by the present technology.

Additionally, some embodiments of the present technology may include an end effector coupled with a baffle structure or assembly, which may allow increased flexibility of baffle assemblies by allowing different end effectors to be used to accommodate different processing conditions. FIG. 7 illustrates a cross-sectional view of a baffle dish including an end effector according to some embodiments of the present technology. As illustrated, a dish 505 as discussed above, although any baffle configuration may be used, may include an end effector 705, which may be fitted or coupled with the dish to provide a profile to facilitate material flow within the processing region. Although an interior taper is shown, it is to be understood that end effectors may be characterized by any interior or exterior profile as previously discussed, and may be or include any material discussed above. By utilizing a baffle according to embodiments of the present technology, chambers may be used for broad ranges of processing pressures or conditions, while maintaining more uniform flow across the different pressure regimes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a ring" includes a plurality of such rings, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing comprising:
   delivering a deposition precursor into a processing region of a semiconductor processing chamber;
   depositing a layer of material on a substrate housed in the processing region of the semiconductor processing chamber, wherein the processing region is maintained at a first pressure during the depositing;
   extending a baffle within the processing region, wherein the baffle modifies a flow path within the processing region;
   forming a plasma of a treatment precursor within the processing region of the semiconductor processing chamber, wherein the processing region is maintained at a second pressure during the forming; and
   treating the layer of material deposited on the substrate with plasma effluents of the treatment precursor.

2. The method of semiconductor processing of claim 1, wherein the semiconductor processing chamber comprises:
   a faceplate;
   a substrate support on which the substrate is seated, wherein the processing region is defined between the faceplate and the substrate support; and
   a pumping ring, wherein the pumping ring extends circumferentially about the processing region.

3. The method of semiconductor processing of claim 2, wherein the baffle extends about the substrate support.

4. The method of semiconductor processing of claim 3, wherein extending the baffle comprises moving the baffle towards the faceplate.

5. The method of semiconductor processing of claim 4, wherein the baffle in an extended position restricts a flow path to the pumping ring.

6. The method of semiconductor processing of claim 5, wherein the baffle reduces a gap distance between an interior edge of the pumping ring and an exterior edge of the faceplate by greater than or about 10%.

7. The method of semiconductor processing of claim 1, wherein depositing the layer of material is performed at a pressure within the processing region of greater than or about 100 Torr, and wherein forming the plasma of the treatment precursor is performed at a pressure within the processing region of less than or about 20 Torr.

8. The method of semiconductor processing of claim 1, wherein the substrate is maintained at a temperature of greater than or about 400° C. during the depositing and during the treating.

9. The method of semiconductor processing of claim 1, wherein the baffle comprises an end effector defining an interior shape configured to control flow to an exhaust system.

10. The method of semiconductor processing of claim 1, further comprising:
    subsequent to depositing the layer of material on the substrate, moving the substrate towards a faceplate of the semiconductor processing chamber.

11. A semiconductor processing system comprising:
    a chamber body comprising sidewalls and a base, the chamber body defining a processing region;
    a substrate support extending through the base of the chamber body, wherein the substrate support is configured to support a substrate within the processing region;

a faceplate defining a plurality of apertures through the faceplate, wherein the faceplate defines the processing region from above;

a pumping ring extending about the processing region and providing an exhaust path from the processing region; and a baffle extending about the substrate support, the baffle translatable between a first position in which the baffle is retracted about the substrate support and a second position in which the baffle is extended into the processing region.

12. The semiconductor processing system of claim 11, wherein the baffle in the second position reduces a gap distance between an interior edge of the pumping ring and an exterior edge of the faceplate by greater than or about 10%.

13. The semiconductor processing system of claim 11, wherein the baffle in the second position intersects a flow path between the faceplate and the pumping ring.

14. The semiconductor processing system of claim 11, wherein the baffle comprises:
   a dish defining a central recess;
   an aperture extending through the dish and configured to receive a stem of the substrate support; and
   one or more posts coupling the dish with an actuator.

15. The semiconductor processing system of claim 11, wherein the baffle comprises an end effector defining an interior shape configured to control flow to an exhaust system.

16. The semiconductor processing system of claim 11, wherein the baffle comprises a ceramic material.

17. A method of semiconductor processing comprising:
   delivering a deposition precursor into a processing region of a semiconductor processing chamber;
   depositing a layer of material on a substrate housed in the processing region of the semiconductor processing chamber, wherein the processing region is maintained at a first pressure greater than or about 100 Torr during the depositing;
   extending a baffle within the processing region, wherein the baffle modifies a flow path within the processing region;
   forming a plasma of a treatment precursor within the processing region of the semiconductor processing chamber, wherein the processing region is maintained at a second pressure less than or about 20 Torr during the forming; and
   treating the layer of material deposited on the substrate with plasma effluents of the treatment precursor.

18. The method of semiconductor processing of claim 17, wherein the baffle reduces a gap distance between an interior edge of a pumping ring defining an exhaust path and an exterior edge of a faceplate defining the processing region from above by greater than or about 10%.

19. The method of semiconductor processing of claim 17, wherein the semiconductor processing chamber comprises:
   a faceplate;
   a substrate support on which the substrate is seated, wherein the processing region is defined between the faceplate and the substrate support; and
   a pumping ring, wherein the pumping ring extends circumferentially about the processing region, and wherein the baffle extends about the substrate support.

20. The method of semiconductor processing of claim 17, wherein the baffle comprises:
   a dish defining a central recess;
   an aperture extending through the dish and configured to receive a stem of the substrate support;
   one or more posts coupling the dish with an actuator; and
   an end effector coupled with the dish and defining an interior shape of the baffle configured to control flow to an exhaust system.

* * * * *